(12) United States Patent
Nakae et al.

(10) Patent No.: US 12,431,409 B2
(45) Date of Patent: Sep. 30, 2025

(54) SEMICONDUCTOR DEVICE AND METHOD OF FORMING THE SAME

(71) Applicant: MICRON TECHNOLOGY, INC., Boise, ID (US)

(72) Inventors: Yutaka Nakae, Higashihiroshima (JP); Nobuyuki Nakamura, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 566 days.

(21) Appl. No.: 17/811,833

(22) Filed: Jul. 11, 2022

(65) Prior Publication Data

US 2024/0014102 A1 Jan. 11, 2024

(51) Int. Cl.
*H01L 23/48* (2006.01)
*H01L 21/768* (2006.01)
*H01L 23/528* (2006.01)
*H01L 23/532* (2006.01)
*H01L 23/535* (2006.01)

(52) U.S. Cl.
CPC ........ *H01L 23/481* (2013.01); *H01L 21/7684* (2013.01); *H01L 21/76898* (2013.01); *H01L 23/528* (2013.01); *H01L 23/53228* (2013.01); *H01L 23/53257* (2013.01); *H01L 23/5329* (2013.01); *H01L 23/535* (2013.01)

(58) Field of Classification Search
CPC ............... H01L 23/481; H01L 21/7684; H01L 21/76898; H01L 23/528; H01L 23/53228; H01L 23/53257; H01L 23/5329; H01L 23/535; H01L 23/5226; H01L 23/5283; H01L 23/5386; H01L 21/76895; H01L 21/76897; H01L 23/5384
See application file for complete search history.

(56) References Cited

U.S. PATENT DOCUMENTS

| | | | |
|---|---|---|---|
| 2013/0313689 A1* | 11/2013 | Torii | H01L 23/481 257/621 |
| 2015/0357325 A1* | 12/2015 | Ding | H10D 86/201 438/455 |
| 2020/0083179 A1* | 3/2020 | Lee | H01L 23/5384 |

\* cited by examiner

*Primary Examiner* — Patricia D Valenzuela
(74) *Attorney, Agent, or Firm* — Dorsey & Whitney LLP

(57) ABSTRACT

An apparatus includes a through-silicon via (TSV) including a conductive material; a first contact plug having an upper surface and a bottom surface directly connected to an upper surface of the TSV; a first wiring directly connected to the upper surface of the first contact plug; a second wiring having an upper surface; a second contact plug having an upper surface and a bottom surface directly connected to the upper surface of the second wiring; and a third wiring directly connected to the upper surface of the second contact plug; wherein the first wiring and the third wiring are in a substantially same level.

19 Claims, 16 Drawing Sheets

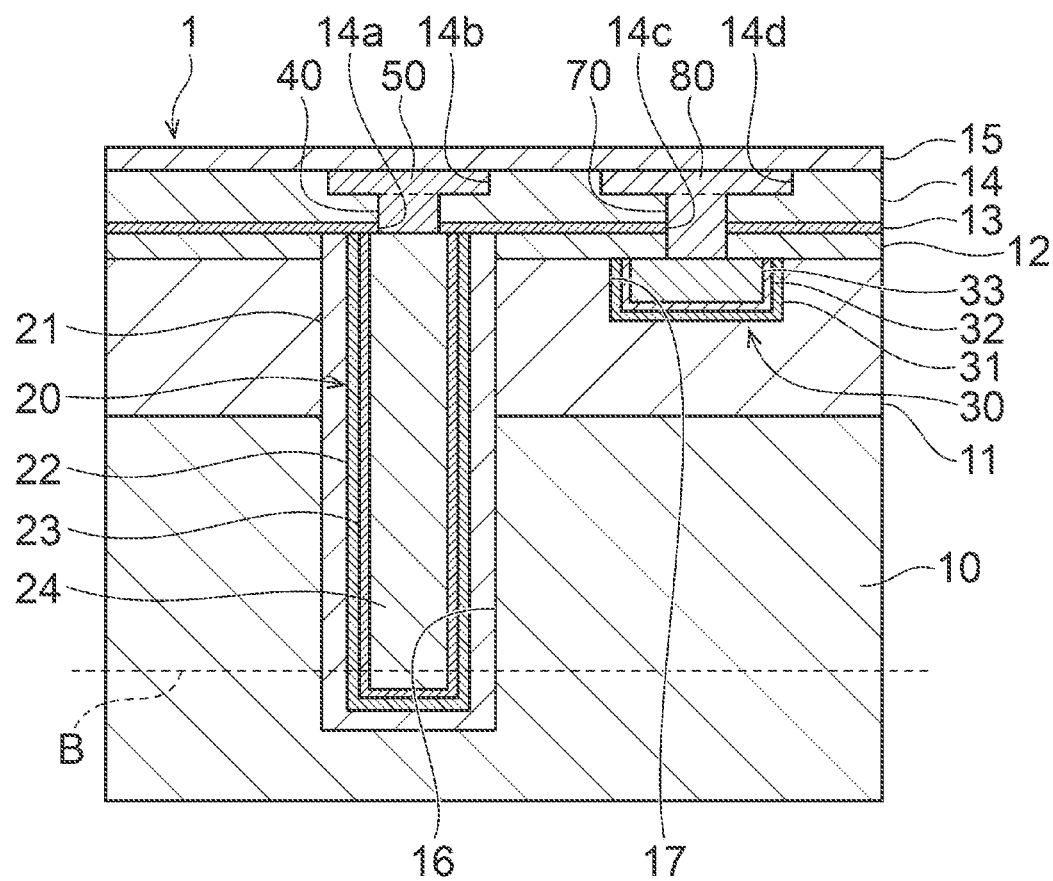
FIG.2
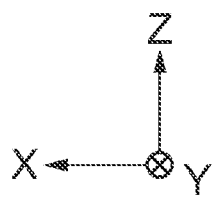

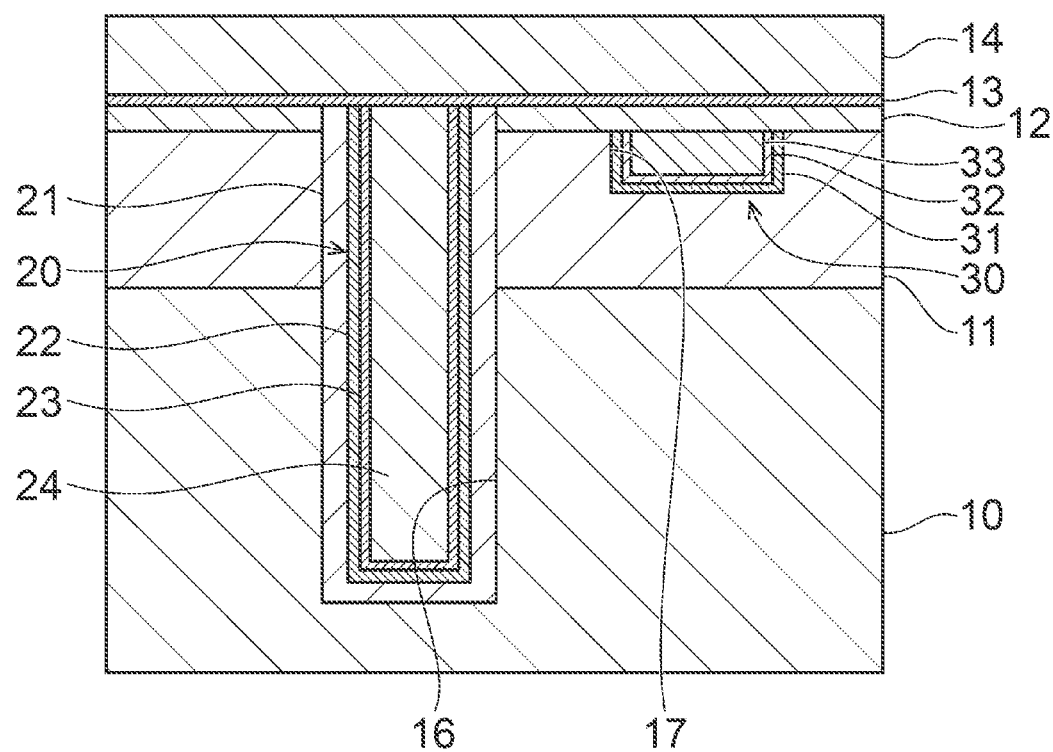
FIG.12
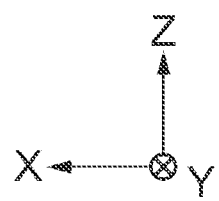

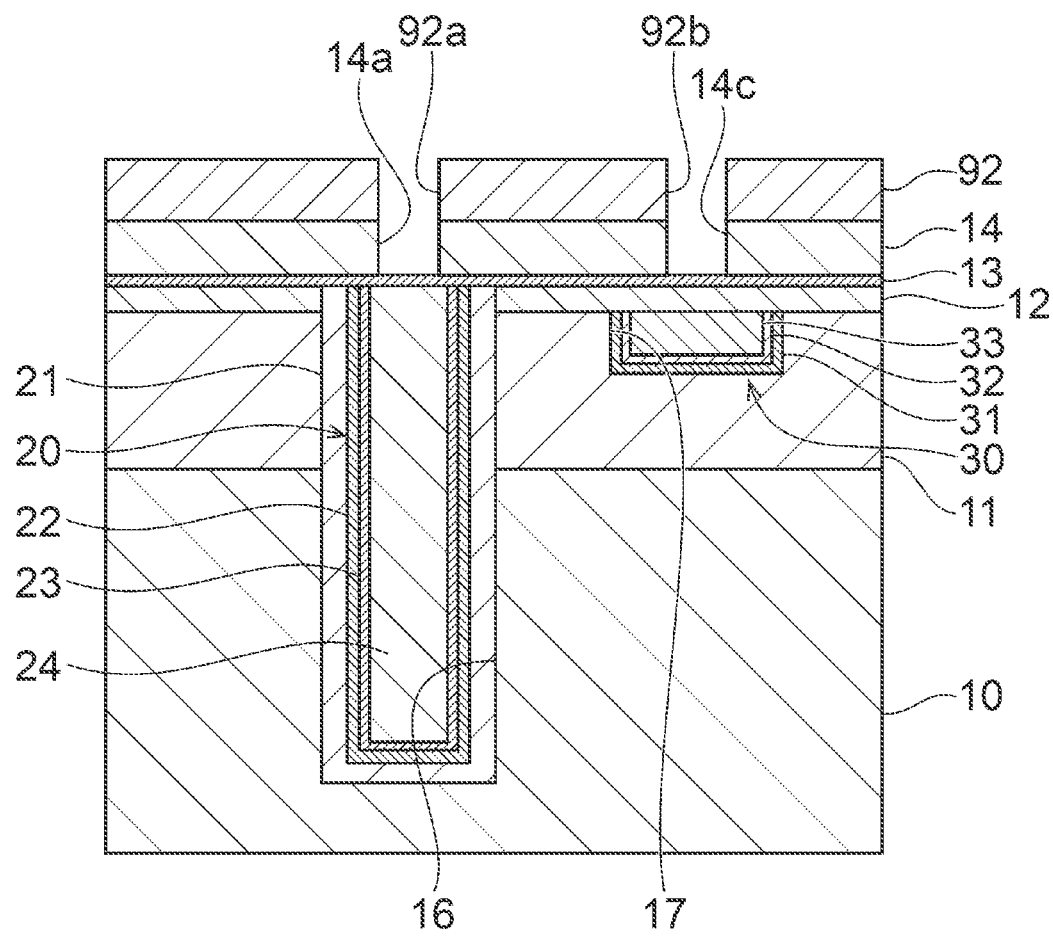
FIG.13
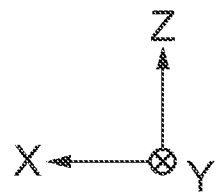

SEMICONDUCTOR DEVICE AND METHOD OF FORMING THE SAME

BACKGROUND

In a semiconductor system including a plurality of semiconductor devices stacked onto each other, the plurality of semiconductor devices may be electrically connected by through-silicon vias (hereinafter referred to as "TSVs"), for example.

BRIEF DESCRIPTION OF THE DRAWINGS

FIG. 2 is a diagram illustrating an example of a schematic configuration of a semiconductor device according to the embodiment. FIG. 2 is a longitudinal section illustrating an example of the schematic configuration of a portion along the line A-A in FIG. 1.

FIGS. 1 to 15 are diagrams illustrating a method of forming a semiconductor device according to the embodiment. FIGS. 2 to 15 are diagrams that sequentially illustrate an example of the schematic configuration in exemplary process stages. FIGS. 2 to 15 are longitudinal sections illustrating the schematic configuration of the portion along the line A-A in FIG. 1.

DETAILED DESCRIPTION

Figure 1:
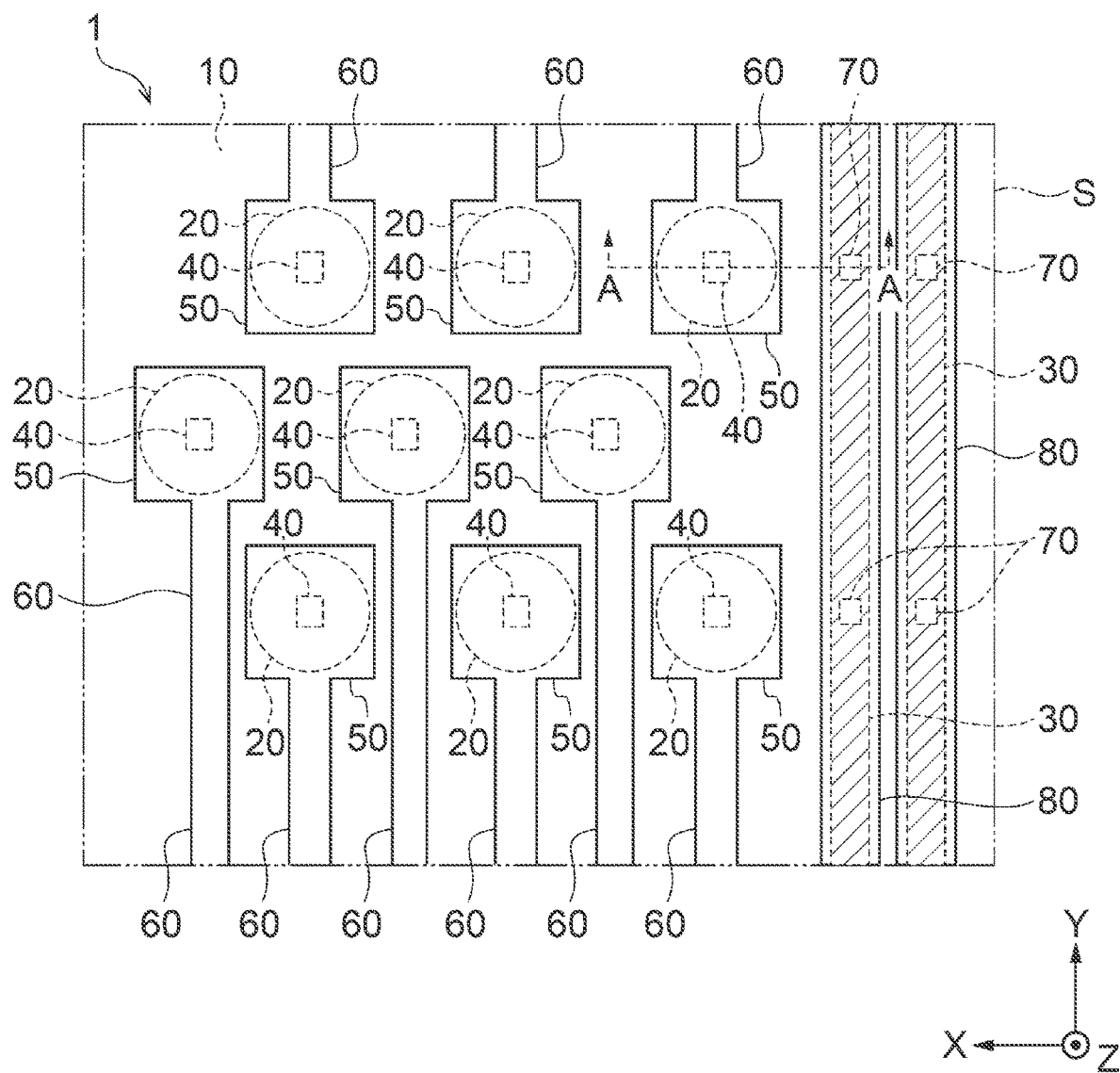
FIG. 1 is a plan layout view illustrating one example of a schematic configuration of a semiconductor device according to an embodiment.

Various embodiments of the present disclosure will be explained below in detail with reference to the accompanying drawings. The following detailed description refers to the accompanying drawings that show, by way of illustration, specific aspects and various embodiments of the present disclosure. The detailed description provides sufficient detail to enable those skilled in the art to practice these embodiments of the present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Hereinafter, a semiconductor device 1 and a method of forming the same according to the embodiment will be described with reference to FIGS. 1 to 16. In the description of the embodiment, common or related elements and elements that are substantially the same are denoted with the same signs, and the description thereof will be reduced or omitted. In the drawings, the dimensions and dimensional ratios of each unit in each of the drawings do not necessarily match the actual dimensions and dimensional rations in the embodiment. In the following description, the vertical direction refers to the top and bottom direction in the case where the back surface of the semiconductor device 1 is disposed at the bottom, and the horizontal direction refers to the direction parallel to the surface of the semiconductor device 1.

Hereinafter, the semiconductor device 1 according to the embodiment will be described. As illustrated in FIGS. 1 and 2, the semiconductor device 1 is provided with a plurality of TSVs 20, a plurality of first wirings 30, a plurality of pad wirings 50, a plurality of second wirings 60, and a plurality of third wirings 80. The plurality of pad wirings 50 are arranged in a staggered layout, for example, on the surface of the semiconductor device 1. The pad wirings 50 have a square shape, for example, in a planar view. The second wirings 60 have a linear shape extending in the Y direction. Each of the second wirings 60 is connected to one of the sides, in the Y direction, of a corresponding pad wiring 50. The plurality of third wirings 80 are arranged adjacent to the region where the plurality of pad wirings 50 and the plurality of second wirings 60 are arranged. The third wirings 80 each have a linear shape extending in the Y direction in FIG. 1.

The semiconductor device 1 is provided with a semiconductor substrate 10. The semiconductor substrate 10 contains single-crystal silicon, for example. A first insulating film 11, a second insulating film 12, a third insulating film 13, a fourth insulating film 14, and a fifth insulating film 15 are provided in a multi-layer structure on the upper surface of the semiconductor substrate 10. The first insulating film 11 and the fourth insulating film 14 contain an insulating material such as silicon dioxide ($SiO_2$), for example. The second insulating film 12, the third insulating film 13, and the fifth insulating film 15 contain an insulating material such as silicon carbonitride (SiCN), for example.

Each TSV 20 is provided inside a first hole 16 which penetrates through the second insulating film 12 and the first insulating film 11 and which has a bottom surface at a prescribed depth in the semiconductor substrate 10. The TSV 20 is provided with a first conductive film 22, a second conductive film 23, and a third conductive film 24. The TSV 20 has a cylindrical plug shape overall. In the TSV 20, a multi-layer film of the first conductive film 22 and the second conductive film 23 is provided around the third conductive film 24. The upper surface of the TSV 20 is substantially flush with (lies in the same plane as) the upper surface of the second insulating film 12.

A sixth insulating film 21 is provided between the TSV 20 and the inner wall of the first hole 16. The sixth insulating film 21 contains an insulating material such as silicon dioxide ($SiO_2$) for example. The first conductive film 22 contains a conductive material such as tantalum (Ta), for example. The second conductive film 23 and the third conductive film 24 contain a conductive material such as copper (Cu), for example.

A first contact electrode 40 and the pad wiring 50 are provided on top of the TSV 20. The TSV 20 and the pad wiring 50 are connected by the first contact electrode 40. The first contact electrode 40 is provided inside a second hole 14a that penetrates through the fourth insulating film 14 and the third insulating film 13. The first contact electrode 40 has a cylindrical plug shape. The lower surface of the first contact electrode 40 is in contact with the upper surface of the TSV 20. The first contact electrode 40 contains a conductive material such as copper (Cu), for example. There may be one or a plurality of first contact electrodes 40 connected on top of a single TSV 20.

The pad wiring 50 is embedded inside a second groove 14b provided in the fourth insulating film 14. The second groove 14b has a prescribed width and depth, and is provided with a square portion and a pattern extending horizontally as illustrated in FIG. 1. The pad wiring 50 and the first contact electrode 40 are connected. The third wiring 80 and a second contact electrode 70 are connected. The first contact electrode 40 and the pad wiring 50 contain a conductive material such as copper (Cu), for example. As illustrated in FIG. 2, the boundary between the first contact electrode 40 and the pad wiring 50 is illustrated by a dashed line, but in actuality, the boundary is indeterminate. In the embodiment, the first contact electrode 40 and the pad wiring 50 form a unified structure. The upper surface of the pad wiring 50, the upper surface of the third wiring 80, and the upper surface of the fourth insulating film 14 are substantially flush with (lie in the same plane as) each other.

The first wiring 30 is disposed inside a first groove 17 provided in the first insulating film 11. The first wiring 30 has a linear shape extending in the Y direction. The first wiring 30 is provided with a multi-layer structure of a fourth conductive film 31, a fifth conductive film 32, and a sixth conductive film 33. The fourth conductive film 31 contains a conductive material such as tantalum (Ta), for example. The fifth conductive film 32 and the sixth conductive film 33 contain a conductive material such as copper (Cu), for example.

The second contact electrode 70 is provided inside a third hole 14c that penetrates through the lower portion of the fourth insulating film 14, the third insulating film 13, and the second insulating film 12. The second contact electrode 70 has a cylindrical plug shape. The lower surface of the second contact electrode 70 is in contact with the upper surface of the first wiring 30. The second contact electrode 70 contains a conductive material such as copper (Cu), for example. The upper surface of the first wiring 30 is covered by the second insulating film 12. The upper surface of the first wiring 30 is disposed at a lower position than the upper surface of the TSV 20.

The third wiring 80 is disposed inside a third groove 14d provided in the fourth insulating film 14. The third groove 14d has a prescribed width and depth in the fourth insulating film 14, and has a linear shape extending in the Y direction as illustrated in FIG. 1. The lower surface of the third wiring 80 is in contact with the upper surface of the second contact electrode 70. The third wiring 80 contains a conductive material such as copper (Cu), for example. As illustrated in FIG. 2, the boundary between the second contact electrode 70 and the third wiring is illustrated by a dashed line, but in actuality, the boundary is indeterminate. In the embodiment, the second contact electrode 70 and the third wiring 80 form a unified structure.

The TSV 20 is electrically connected to the pad wiring 50 through the first contact electrode 40. The first wiring 30 is electrically connected to the third wiring 80 through the second contact electrode 70. The lower surface of the semiconductor device 1 is abrasively removed to the line B illustrated in FIG. 2, thereby exposing the lower surface of the TSV 20 on the lower surface of the semiconductor device 1. The TSV 20 vertically penetrates through the semiconductor device 1.

Next, FIGS. 2 to 15 will be referenced to describe a method of forming the semiconductor device 1 according to the embodiment. FIGS. 2 to 15 are diagrams that sequentially illustrate an example of the schematic configuration in exemplary process stages. FIGS. 2 to 15 are longitudinal sections illustrating the schematic configuration of the portion along the line A-A in FIG. 1.

Figure 3:
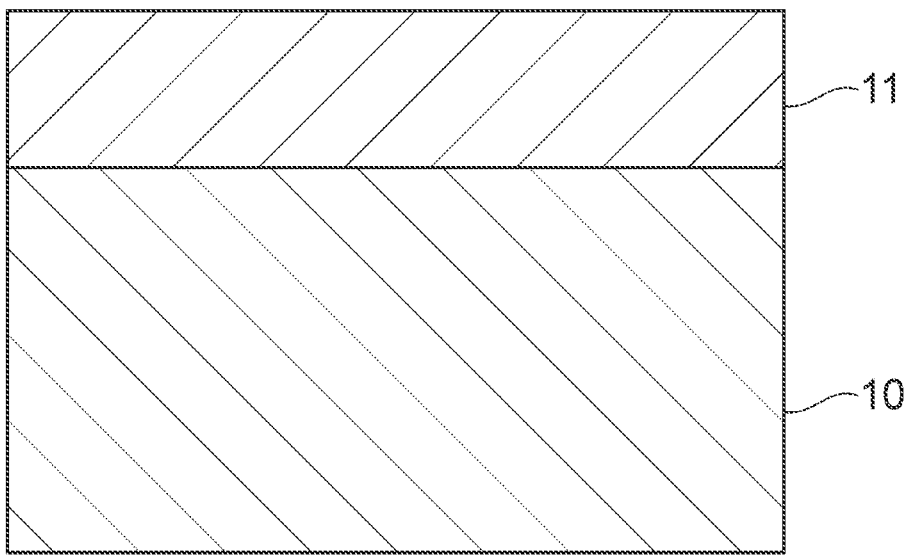

As illustrated in FIG. 3, the first insulating film 11 is formed on top of the semiconductor substrate 10. For the semiconductor substrate 10, a single-crystal silicon substrate can be used, for example. The first insulating film 11 contains an insulating material such as silicon dioxide ($SiO_2$), for example.

Figure 4:
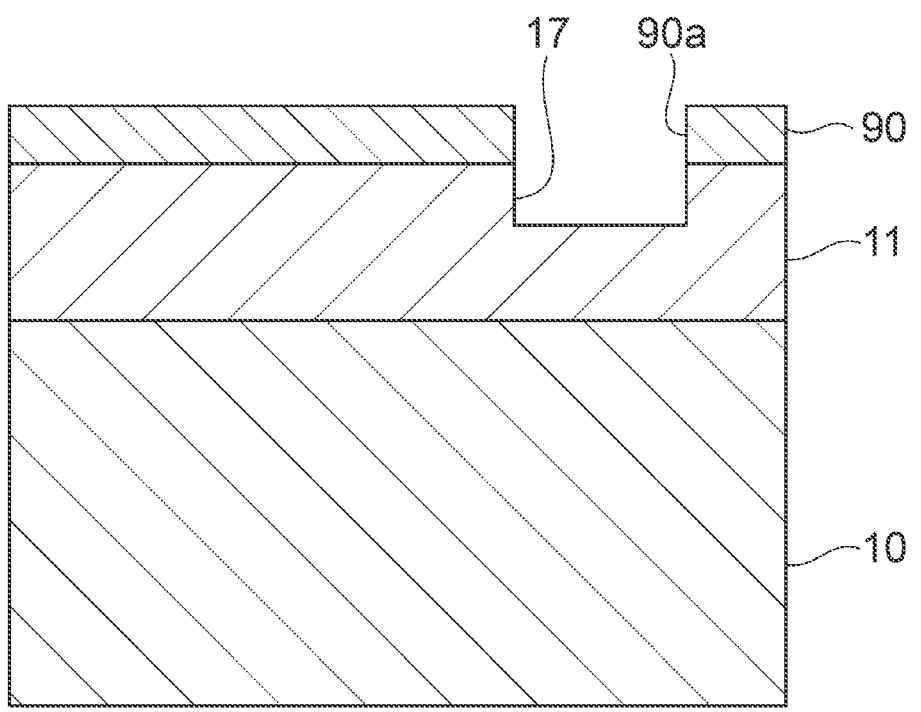

Next, as illustrated in FIG. 4, a photoresist 90 with an opening 90a formed therein is formed according to known photolithography technology. Immediately after the formation of the photoresist 90, the upper surface of the first insulating film 11 is exposed in the opening 90a. The opening 90a is formed in a pattern corresponding to the first wiring 30 illustrated in FIG. 1. Next, known anisotropic dry etching technology is carried out by using the photoresist 90 as a mask. With this step, the first insulating film 11 exposed in the opening 90a is etched to a prescribed depth, and the first groove 17 is formed.

Figure 5:
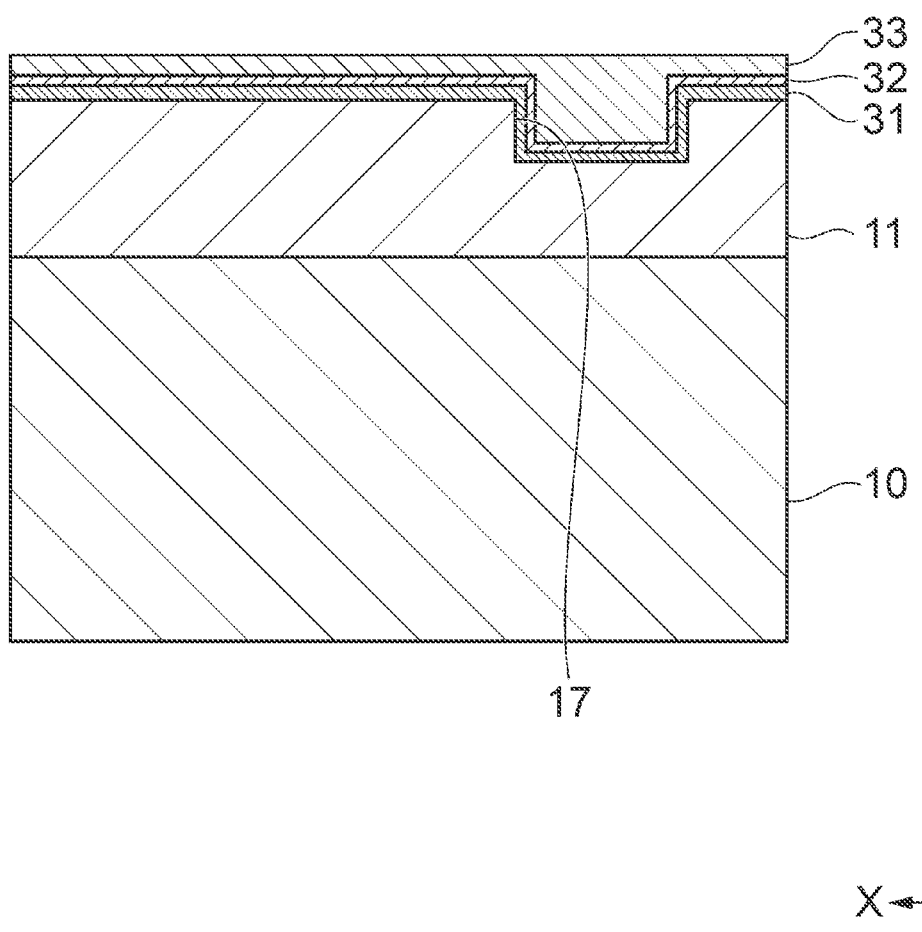

Next, after stripping the photoresist 90, a multi-layer film of the fourth conductive film 31 and the fifth conductive film 32 is formed on top of the first insulating film 11 with the first groove 17 formed therein, as illustrated in FIG. 5. The fourth conductive film 31 contains a conductive material such as lanthanum (La), for example. The fifth conductive film 32 contains a conductive material such as copper (Cu), for example. The fourth conductive film 31 and the fifth conductive film 32 are formed by known sputtering technology, for example. The fourth conductive film 31 and the fifth conductive film 32 cover the upper surface of the first insulating film 11 and the side walls and bottom surface of the first groove 17. Next, the sixth conductive film 33 is formed so as to cover the upper surface of the fifth conductive film 32 and be embedded inside the first groove 17. The sixth conductive film 33 contains a conductive material such as copper (Cu), for example. The sixth conductive film 33 is formed by known plating technology, for example.

Figure 6:
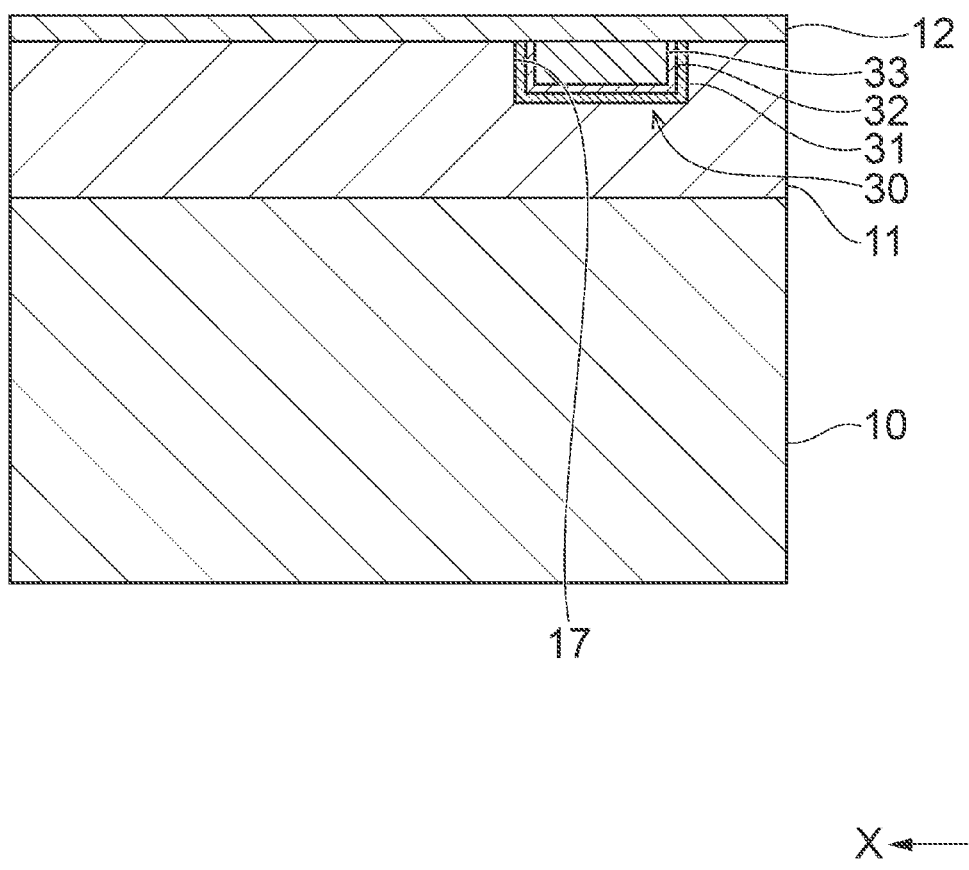

Next, as illustrated in FIG. 6, known chemical mechanical polishing (hereinafter referred to as CMP) technology is used to polish the sixth conductive film 33, the fifth conductive film 32, and the fourth conductive film 31. The CMP is performed until the upper surface of the first insulating film 11 is exposed. With this step, a multi-layer structure is formed in which the fourth conductive film 31, the fifth conductive film 32, and the sixth conductive film 33 are embedded inside the first groove 17. The fourth conductive film 31, the fifth conductive film 32, and the sixth conductive film 33 function as the first wiring 30. Next, the second insulating film 12 is formed so as to cover the upper surfaces of the first insulating film 11 and the first wiring 30. The second insulating film 12 contains an insulating material such as silicon carbonitride (SiCN), for example. The second insulating film 12 is formed by CVD technology, for example.

Figure 7:
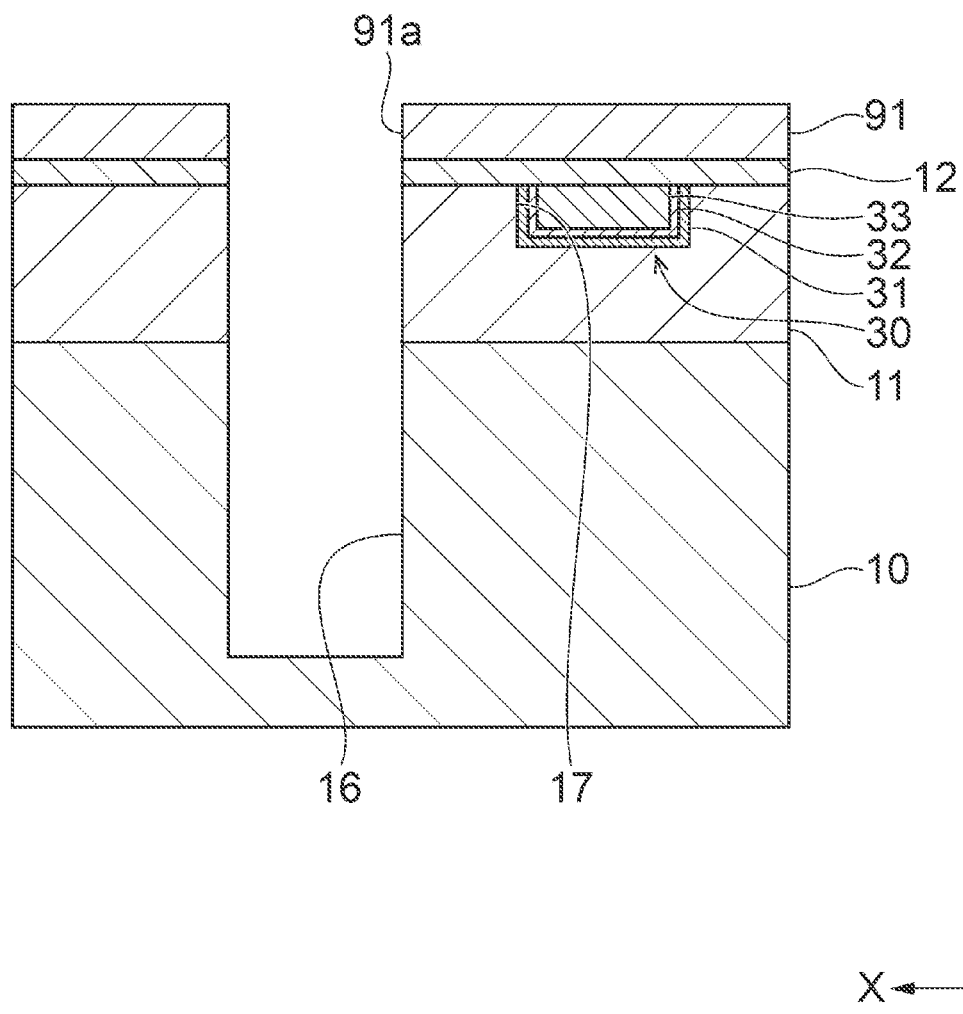

Next, as illustrated in FIG. 7, a photoresist 91 with an opening 91a formed therein is formed according to known photolithography technology. Immediately after the formation of the photoresist 91, the upper surface of the second insulating film 12 is exposed in the opening 91a. The opening 91a is formed in a pattern corresponding to the TSV 20 illustrated in FIG. 1. Next, known anisotropic dry etching technology is carried out by using the photoresist 91 as a mask. The etching causes the pattern of the opening 91a to be transferred to the second insulating film 12, the first insulating film 11, and the semiconductor substrate 10. With this step, the second insulating film 12 and the first insulating film 11 are penetrated and moreover the semiconductor substrate 10 is etched to a prescribed depth in the opening 91a, thereby forming the first hole 16.

Figure 8:
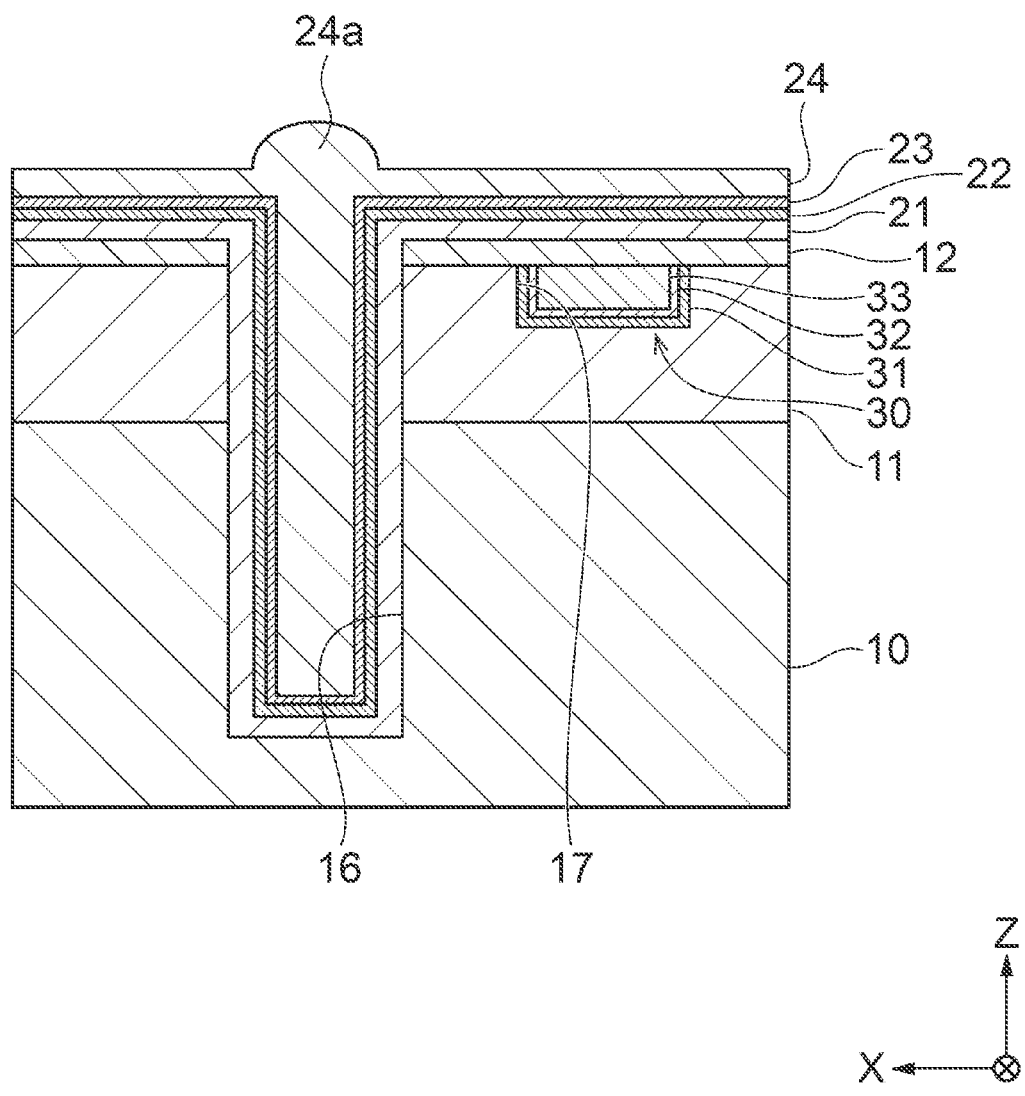

Next, after stripping the photoresist 91, the sixth insulating film 21 is formed on top of the second insulating film 12 and inside the first hole 16, as illustrated in FIG. 8. The sixth insulating film 21 contains an insulating material such as silicon dioxide ($SiO_2$) for example. The sixth insulating film 21 is formed by CVD using tetraethyl orthosilicate (hereinafter referred to as TEOS), for example. Next, a multi-layer film of the first conductive film 22 and the second conductive film 23 is formed to cover the sixth insulating film 21.

The first conductive film 22 contains a conductive material such as lanthanum (La), for example. The second conductive film 23 contains a conductive material such as copper (Cu), for example. The first conductive film 22 and the second conductive film 23 are formed by known sputtering technology, for example. The first conductive film 22 and the second conductive film 23 cover the sixth insulating film 21 formed on top of the second insulating film 12 and on the inner wall of the first hole 16.

Next, the third conductive film 24 is formed so as to cover the upper surface of the second conductive film 23 and be embedded inside the first hole 16. The third conductive film 24 contains a conductive material such as copper (Cu), for example. The third conductive film 24 is formed by known plating technology. After the first hole 16 is filled with the third conductive film 24, a raised projection 24a is formed above the first hole 16.

Figure 9:
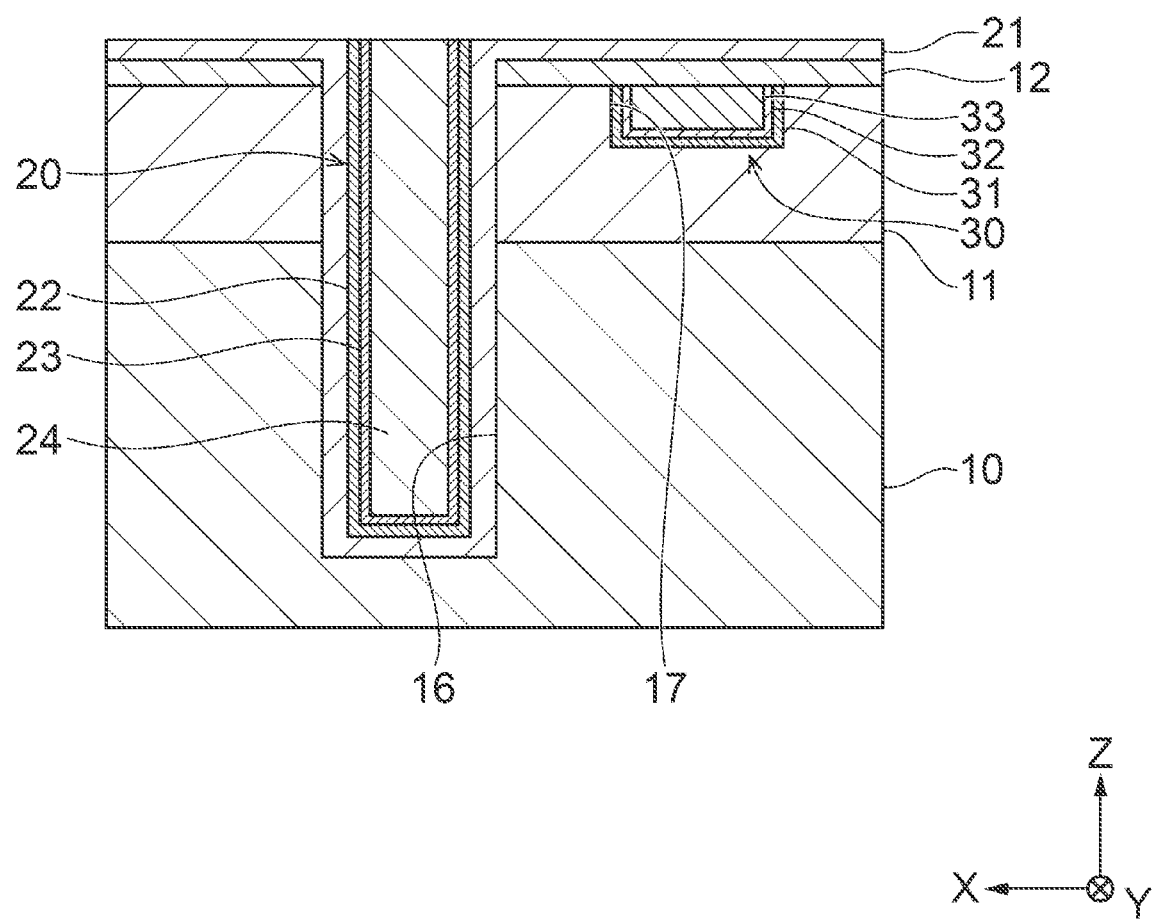
Figure 10:
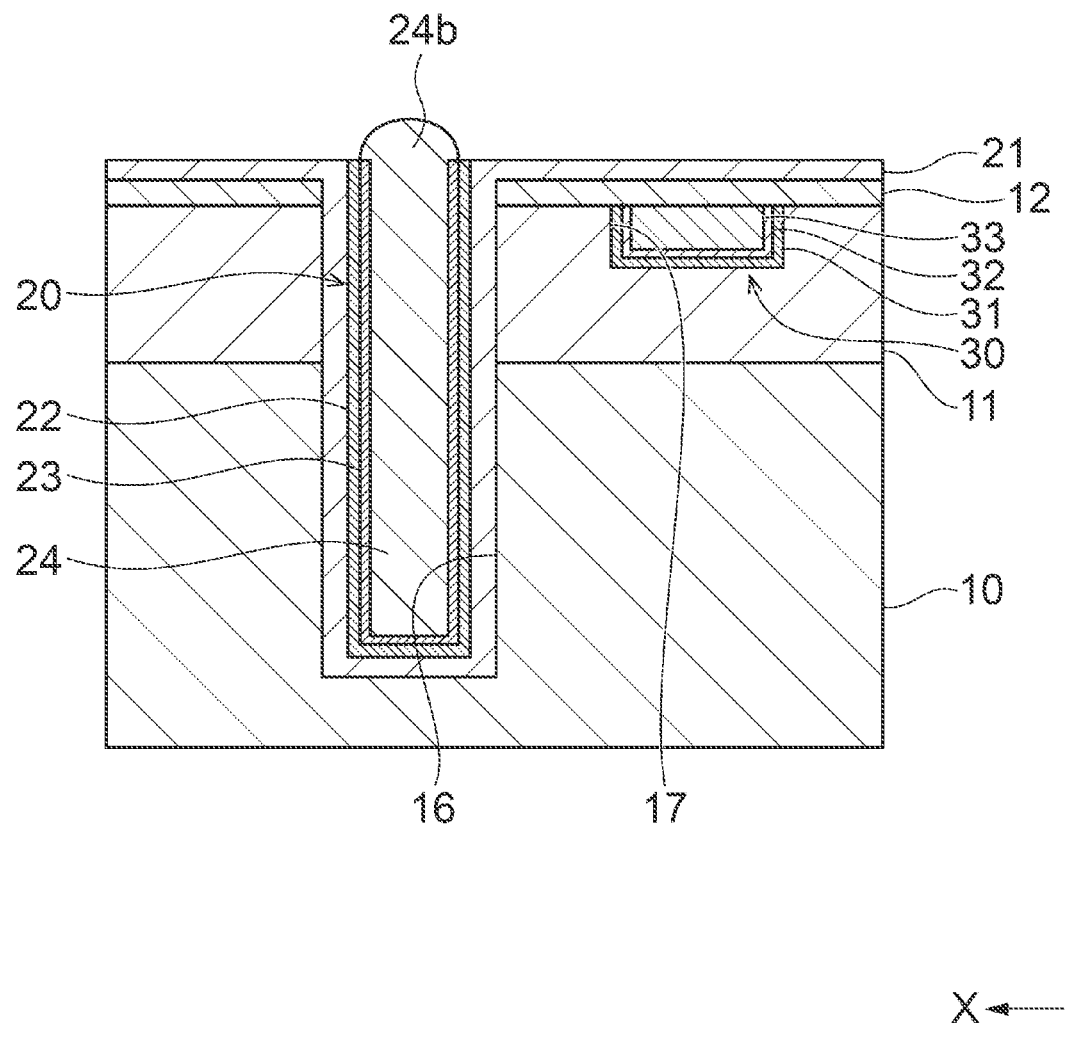

Next, as illustrated in FIG. 9, the third conductive film 24, the second conductive film 23, and the first conductive film 22 are abrasively removed by known CMP technology. The CMP is performed until the upper surface of the sixth insulating film 21 is exposed. With this step, a multi-layer structure is formed in which the first conductive film 22, the second conductive film 23, and the third conductive film 24 are embedded inside the first hole 16. The first conductive film 22, the second conductive film 23, and the third conductive film 24 function as the TSV 20. Next, as illustrated in FIG. 10, annealing is performed. The annealing is performed at a temperature of approximately 1000° C., for example, in a nitrogen atmosphere, for example. The annealing causes the third conductive film 24 to expand, and a projection 24b is formed in the upper portion of the third conductive film 24.

Figure 11:
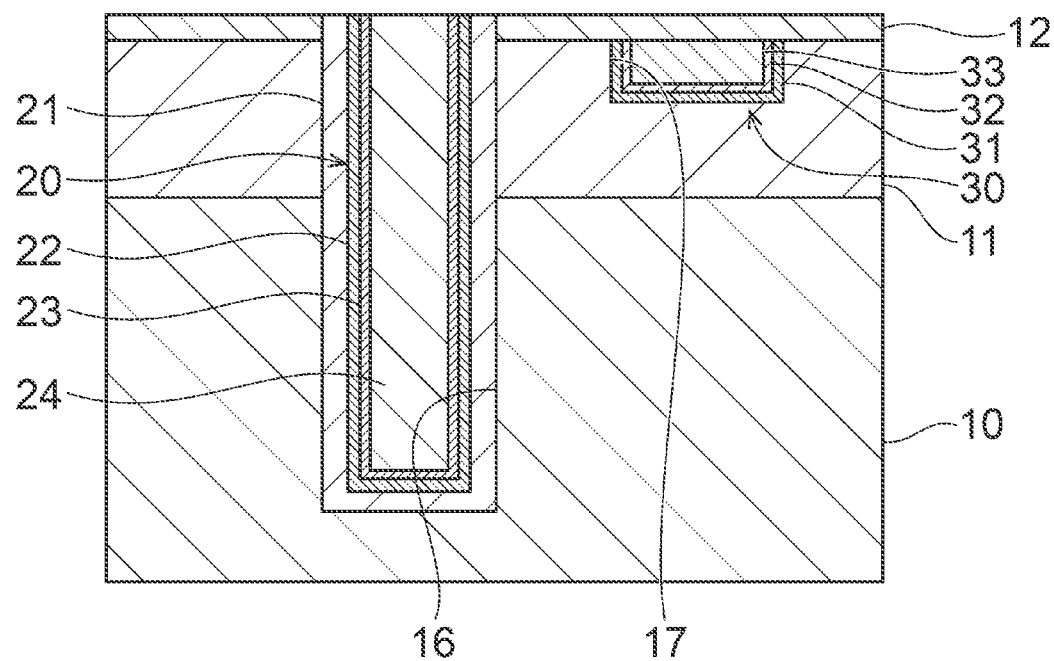

Next, as illustrated in FIG. 11, known CMP technology is used to polish the sixth insulating film 21, the first conductive film 22, the second conductive film 23, the third conductive film 24, and the projection 24b until the upper surface of the second insulating film 12 is exposed. With this step, the upper surfaces of the second insulating film 12, the sixth insulating film 21, the first conductive film 22, the second conductive film 23, and the third conductive film 24 are made flat. The upper surfaces of the second insulating film 12, the sixth insulating film 21, the first conductive film 22, the second conductive film 23, and the third conductive film 24 form a substantially continuous plane. The upper surface of the TSV 20 is substantially flush with (lies in the same plane as) the upper surface of the second insulating film 12.

Next, as illustrated in FIG. 12, the third insulating film 13 and the fourth insulating film 14 are formed in multiple layers in the above order so as to cover the upper surfaces of the second insulating film 12, the sixth insulating film 21, the first conductive film 22, the second conductive film 23, and the third conductive film 24. The third insulating film 13 contains an insulating material such as silicon carbonitride (SiCN), for example. The fourth insulating film 14 contains an insulating material such as silicon dioxide ($SiO_2$) for example. The third insulating film 13 and the fourth insulating film 14 are formed by CVD technology, for example.

Next, as illustrated in FIG. 13, a photoresist 92 provided with openings 92a and 92b is formed on the fourth insulating film 14 by known photolithography technology. Immediately after the formation of the photoresist 92, the upper surface of the fourth insulating film 14 is exposed in the openings 92a and 92b. The openings 92a and 92b correspond, respectively, to the first contact electrode 40 and the second contact electrode 70 illustrated in FIG. 1.

Next, known anisotropic dry etching technology is performed using the photoresist 92 as a mask to etch the fourth insulating film 14 exposed in the openings 92a and 92b. The etching is performed under conditions such that the etch rate of the fourth insulating film 14 is higher than the etch rate of the third insulating film 13. The etching is performed until the upper surface of the third insulating film 13 is exposed. The etching causes the pattern of the openings 92a and 92b to be transferred to the fourth insulating film 14, such that the second hole 14a and the third hole 14c are formed.

Figure 14:
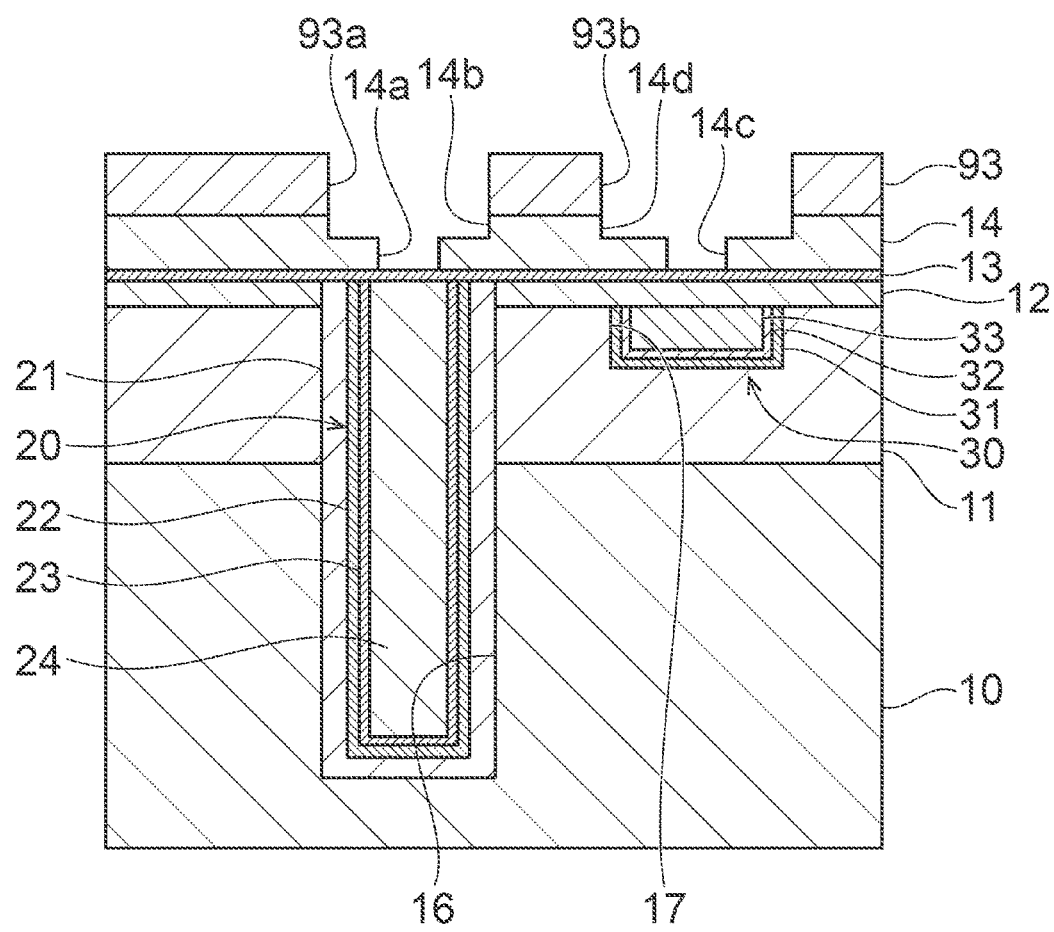
Figure 14:
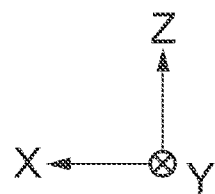

Next, after stripping the photoresist 92, a photoresist 93 provided with openings 93a and 93b is formed by known photolithography technology, as illustrated in FIG. 14. Immediately after the formation of the photoresist 93, the upper surfaces of the second hole 14a, the third hole 14c, and the fourth insulating film 14 are exposed in the openings 93a and 93b. The opening 93a corresponds to the pad wiring 50 and the second wiring 60 in FIG. 1. The opening 93b corresponds to the third wiring 80 illustrated in FIG. 1.

Next, known anisotropic dry etching technology is performed using the photoresist 93 as a mask to partially etch the upper portion of the fourth insulating film 14 in the openings 93a and 93b. The etching is performed under conditions such that the etch rate of the fourth insulating film 14 is higher than the etch rate of the third insulating film 13. The etching causes the pattern of the openings 93a and 93b to be transferred to the fourth insulating film 14, such that the second groove 14b and the third groove 14d are formed.

Figure 15:
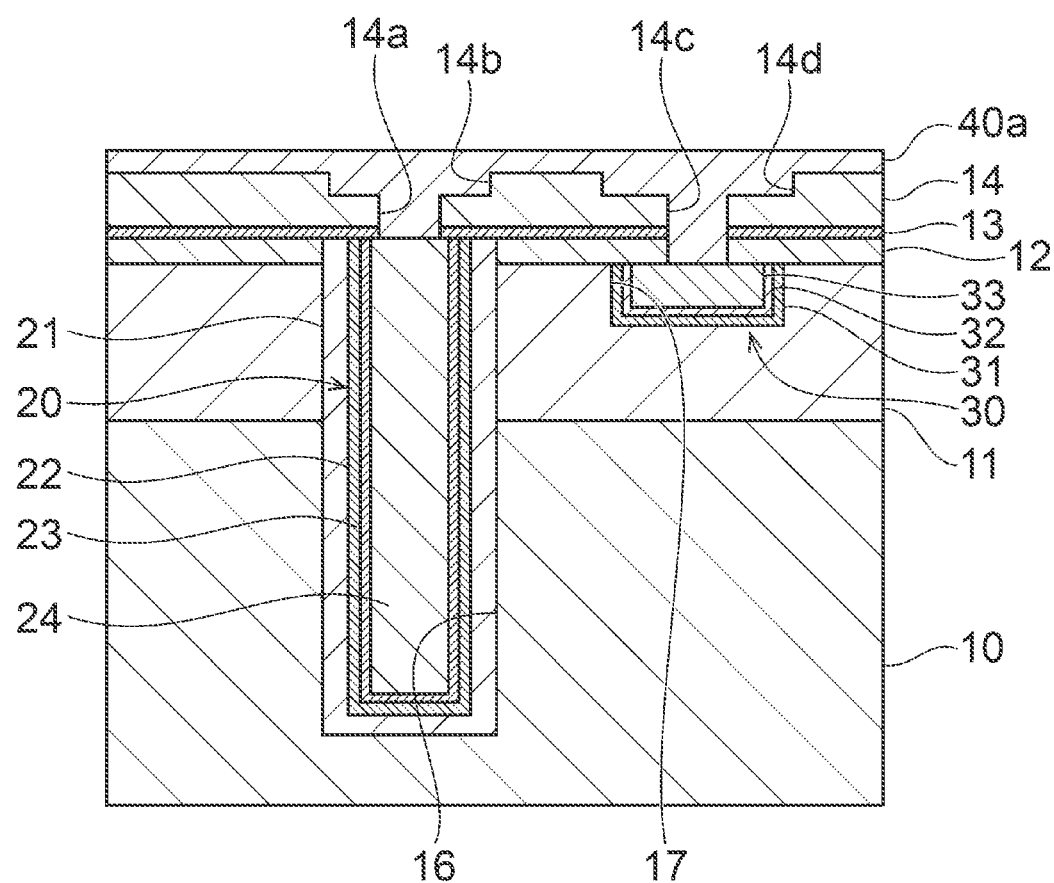

Next, after stripping the photoresist 93, anisotropic dry etching is performed to etch the second insulating film 12 and the third insulating film 13. The anisotropic dry etching is performed under conditions such that the etch rate of the second insulating film 12 and the third insulating film 13 is higher than the etch rate of the fourth insulating film 14, the third conductive film 24, and the sixth conductive film 33. Through the anisotropic dry etching, the third insulating film 13 in the second hole 14a is etched and the upper surface of the TSV 20 is exposed. Also, through the anisotropic dry etching, the third insulating film 13 and the second insulating film 12 in the third hole 14c are etched, and the upper surface of the first wiring 30 is exposed. Next, as illustrated in FIG. 15, a seventh conductive film 40a is formed. The seventh conductive film 40a contains a conductive material such as copper (Cu), for example. The seventh conductive film 40a is formed by known plating technology. The seventh conductive film 40a is formed so as to cover the upper surfaces of the third insulating film 13 and the fourth insulating film 14, and be embedded inside the second hole 14a, the second groove 14b, the third hole 14c, and the third groove 14d.

Next, as illustrated in FIGS. 1 and 2, known CMP technology is used to polish the seventh conductive film 40a until the upper surface of the fourth insulating film 14 is exposed, after which the fifth insulating film 15 is formed. With this step, the second hole 14a, the second groove 14b, the third hole 14c, and the third groove 14d in the fourth insulating film 14 are filled by the seventh conductive film 40a. The portion of the seventh conductive film 40a that is formed in the second hole 14a functions as the first contact electrode 40. The portion that is formed in the second groove 14b is the pad wiring 50 and the second wiring 60. The portion of the seventh conductive film 40a that is formed in the third hole 14c functions as the second contact electrode 70. The portion that is formed in the third groove 14d is the third wiring 80. The TSV 20 is connected to the pad wiring 50 through the first contact electrode 40. The first wiring 30 is connected to the third wiring 80 through the second contact electrode 70. Due to the CMP, the upper surface of the pad wiring 50, the upper surface of the third wiring 80, and the upper surface of the fourth insulating film 14 are substantially flush with (lie in the same plane as) each other.

In the steps disclosed above, the second hole 14a, the second groove 14b, the third hole 14c, and the third groove 14d are filled by the seventh conductive film 40a in a unified way by using what is referred to as dual damascene technology. Consequently, the first contact electrode 40, the pad wiring 50, and the second wiring 60 are formed in a unified way, and the second contact electrode 70 and the third wiring 80 are formed in a unified way. In FIG. 2, the boundary between the first contact electrode 40 and the pad wiring 50 and the boundary between the second contact electrode 70 and the third wiring 80 are illustrated by dashed lines for convenience, but in actuality, the boundaries are indeterminate. Note that in the case of using what is referred to as single damascene technology instead of dual damascene technology, the step for forming the first contact electrode 40 and the second contact electrode 70, the step for forming the pad wiring 50, and the step for forming the second wiring 60 and the third wiring 80 are treated as separate steps. In this case, the above boundaries are determinable.

Next, the fifth insulating film 15 is formed so as to cover the upper surfaces of the third insulating film 13, the pad wiring 50, and the third wiring 80. The fifth insulating film 15 contains an insulating material such as silicon carbonitride (SiCN), for example. The fifth insulating film 15 is formed by CVD technology, for example. Through the above steps, the structure illustrated in FIGS. 1 and 2 is formed.

The semiconductor device 1 is subsequently worked into a mountable structure by a backend manufacturing process. In the backend manufacturing process, the back surface of the semiconductor substrate 10 is polished to the line B illustrated in FIG. 2 to achieve a state in which the bottom end of the TSV 20 is exposed on the back surface of the semiconductor substrate 10. With this arrangement, the TSV 20 vertically penetrating the semiconductor device 1 is formed. In the case of stacking a plurality of semiconductor devices 1 formed by the above processes, a structure is obtained in which the TSV 20 provides electrical continuity between the semiconductor devices 1.

The method of forming the semiconductor device 1 disclosed above illustrates an example in which the step for forming the TSV 20 is performed after the step for forming the first wiring 30, but is not limited thereto. The step for forming the TSV 20 may be performed first, and then the step for forming the first wiring 30 may be performed. The TSV 20 and the first wiring 30 may be referred to a first layer structure having the TSV 20 and the first wiring 30 substantially in the same level. A second layer structure on the first layer structure may include the pad wiring 50 and the first contact electrode 40, and the third wiring 80 and the second contact electrode 70 in some embodiments.

Figure 16:
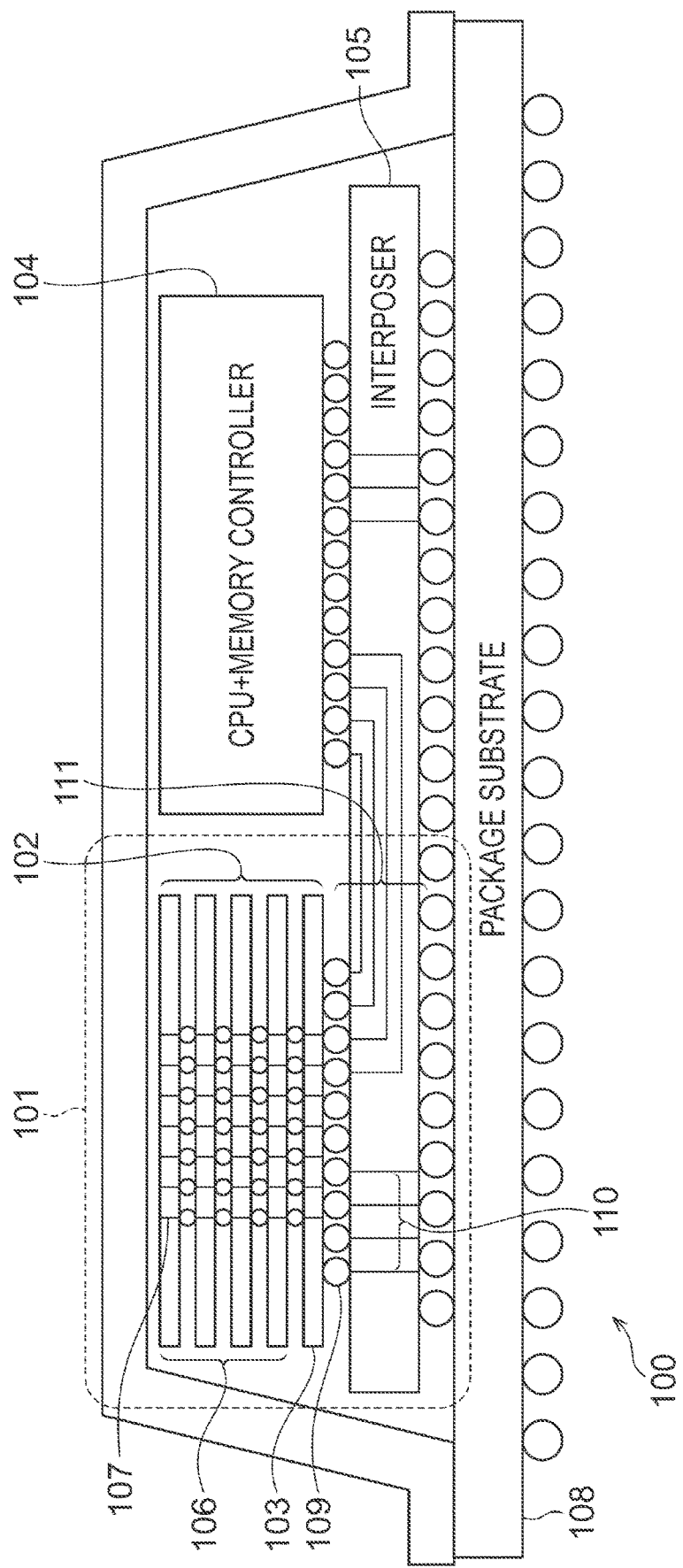
FIG. 16 is a longitudinal section illustrating an example of a schematic configuration of a semiconductor system provided with a semiconductor device according to the embodiment.

Next, FIG. 16 will be referenced to describe an embodiment in which a semiconductor memory device 101 obtained by stacking a plurality of the semiconductor devices 1 is mounted in a semiconductor system 100. Note that in the following description, the memory core chips 106 correspond to the semiconductor device 1, and the TSVs 107 correspond to the TSV 20.

FIG. 16 is a schematic diagram of a semiconductor system 100 including an apparatus, which is a semiconductor memory device 101 in accordance with an embodiment of the present disclosure. The semiconductor system 100 may also include a central processing unit (CPU) and memory controller 104, which may be a controller chip, on an interposer 105 on a package substrate 108. The interposer 105 may include one or more power lines 110 which may supply power supply voltage from the package substrate 108. The interposer 105 may include a plurality of channels 111 that may interconnect the CPU and memory controller 104 and the semiconductor memory device 101. For example, the semiconductor memory device 101 may be a dynamic random access memory (DRAM). The memory controller 104 may provide a clock signal, a command signal, and may further transmit and receive data signals. The plurality of channels 111 may transmit the data signals between the memory controller and the semiconductor memory device 101. The semiconductor memory device 101 may include a plurality of chips 102 including an interface (I/F) chip 103 and a plurality of memory core chips 106 stacked with each other. Please note that a number of the plurality of memory core chips 106 may not be limited to 4 and may be more or fewer as appropriate. Each of the memory core chip 106 may include a plurality of memory cells and circuitries accessing the memory cells. For example, the memory cells may be dynamic random access memory (DRAM) memory cells. The semiconductor memory device 101 may include conductive vias TSVs 107 (e.g., through substrate electrodes) which couple the OF chip 103 and the plurality of memory core chips 106 by penetrating the OF chip 103 and the plurality of memory core chips 106. The OF chip 103 may be coupled to the interposer 105 via interconnects, such as bumps 109. For example, the bumps 109 may be microbumps having bump pitches of less than about or less than one hundred micrometers and exposed on an outside of the OF chip 103. A portion of the bumps 109 may be coupled to the one or more power lines 110. Another portion of the bumps 109 may be coupled to the plurality of channels 111.

According to the semiconductor device 1 and the method for forming the same according to the embodiment, the following effects are obtained. In the semiconductor device 1 according to the above embodiment, the first contact electrode 40 can be connected to the TSV 20 directly, without going through an electrode formed in the same conductive layer as the first wiring 30, for example. Consequently, an increase in the capacitance of the TSV 20 can be suppressed.

As above, DRAM is described as an example of the semiconductor device according to the embodiments, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor device. Furthermore, devices other than memory, including logic ICs such as a microprocessor and an application-specific integrated circuit (ASIC) for example are also applicable as the semiconductor device according to the foregoing embodiments.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure.

It is also contemplated that various combination or sub-combination of the specific features and aspects of the embodiments may be made and still fall within the scope of the disclosures. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:
   a through-silicon via (TSV) including a conductive material;
   a first contact plug having an upper surface and a bottom surface directly connected to an upper surface of the TSV;
   a first wiring directly connected to the upper surface of the first contact plug;
   a second wiring having an upper surface;
   a second contact plug having an upper surface and a bottom surface directly connected to the upper surface of the second wiring; and
   a third wiring directly connected to the upper surface of the second contact plug;
   wherein the first wiring and the third wiring are in a substantially same level.

2. The apparatus of claim 1, further comprising:
   a semiconductor substrate;
   a first insulating film on the semiconductor substrate; and
   a second insulating film on the first insulating film;
   wherein the TSV penetrates the semiconductor substrate, the first insulating film and the second insulating film.

3. The apparatus of claim 2,
   wherein the second insulating film is provided on the first insulating film and the second wiring;
   wherein the upper surface of the TSV and the upper surface of the second insulating film are substantially flush with each other.

4. The apparatus of claim 1, wherein the TSV includes a multi-layer structure of tantalum and copper.

5. The apparatus of claim 1, wherein the first contact plug includes copper.

6. The apparatus of claim 1, wherein the first wiring includes copper.

7. The apparatus of claim 1, wherein the second contact plug includes copper.

8. The apparatus of claim 1, wherein the third wiring includes copper.

9. The apparatus of claim 2, wherein the semiconductor substrate includes single-crystal silicon.

10. The apparatus according to claim 1, wherein the third wiring is arranged adjacent to a region where the first wiring is arranged in a horizontal direction.

11. The apparatus according to claim 1, wherein
    the first wiring and the third wiring are adjacent to each other in a horizontal direction, and
    the TSV and the second wiring are adjacent to each other in the horizontal direction.

12. An apparatus comprising:
    a first layer structure including:
      a through-silicon via (TSV); and
      a first wiring substantially in the same level as the TSV; and
    a second layer structure on the first layer structure, the second layer structure including:
      a second wiring;
      a third wiring substantially in the same level as the second wiring;
      a first contact plug sandwiched between the TSV and the second wiring; and
      a second contact plug sandwiched between the first wiring and the third wiring.

13. The apparatus of claim 12, wherein the TSV includes a multi-layer structure of tantalum and copper.

14. The apparatus of claim 12, wherein the second wiring and the third wiring are composed of copper.

15. The apparatus of claim 12, wherein the first contact plug and the second contact plug are composed of copper.

16. The apparatus of claim 12, further comprising:
    a semiconductor substrate;
    a first insulating film on the semiconductor substrate; and
    a second insulating film on the first insulating film;
    wherein the TSV penetrates the semiconductor substrate, the first insulating film and the second insulating film.

17. The apparatus of claim 12,
    wherein the second insulating film is provided on the first insulating film and the first wiring;
    wherein the upper surface of the TSV and the upper surface of the second insulating film are substantially flush with each other.

18. The apparatus according to claim 12, wherein
    in the first layer structure, the first wiring is arranged adjacent to a region where the TSV is arranged in a horizontal direction, and
    in the second layer structure, the third wiring is arranged adjacent to a region where the second wiring is arranged in the horizontal direction.

19. The apparatus according to claim 18, wherein the TSV and the second wiring are arranged in the same region.

* * * * *